United States Patent
Uchiyama

(10) Patent No.: US 6,671,024 B1
(45) Date of Patent: *Dec. 30, 2003

(54) CONNECTING STRUCTURE, LIQUID CRYSTAL DEVICE, ELECTRONIC EQUIPMENT, AND ANISOTROPIC CONDUCTIVE ADHESIVE AGENT AND A MANUFACTURING METHOD THEREOF

(75) Inventor: Kenji Uchiyama, Hotaka-machi (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/171,924

(22) PCT Filed: Feb. 16, 1998

(86) PCT No.: PCT/JP98/00648

§ 371 (c)(1),
(2), (4) Date: Oct. 27, 1998

(87) PCT Pub. No.: WO98/38701

PCT Pub. Date: Sep. 3, 1998

(30) Foreign Application Priority Data

Feb. 27, 1997 (JP) .............................................. 9-44385

(51) Int. Cl.⁷ ............................................ G02F 1/1345
(52) U.S. Cl. ...................................... 349/152; 349/149
(58) Field of Search ................................ 349/149, 150, 349/151, 152

(56) References Cited

U.S. PATENT DOCUMENTS

| | | | | |
|---|---|---|---|---|
| 5,001,542 A | * | 3/1991 | Tsukagoshi et al. | ........... 357/68 |
| 5,065,505 A | * | 11/1991 | Matsubara et al. | ......... 252/512 |
| 5,644,373 A | * | 7/1997 | Furushima et al. | ......... 349/158 |
| 6,042,894 A | * | 3/2000 | Goto et al. | ................. 427/504 |

FOREIGN PATENT DOCUMENTS

| | | |
|---|---|---|
| JP | 462714 | 2/1992 |
| JP | 4366630 | 12/1992 |
| JP | 625627 | 2/1994 |
| JP | 7197001 | 8/1995 |
| JP | 8188760 | 7/1996 |
| JP | 8-279371 | 10/1996 |
| JP | 8-316625 | 11/1996 |
| JP | 9-161543 | 6/1997 |

* cited by examiner

*Primary Examiner*—Toan Ton
*Assistant Examiner*—Dung Nguyen
(74) *Attorney, Agent, or Firm*—Harness, Dickey & Pierce, P.L.C.

(57) ABSTRACT

In order to provide an anisotropic conductive adhesive agent which is capable of including a predetermined number of conductive particles between the terminals to be connected in a sure manner and which improves the conductive reliability, a plurality of conductive particles 3 included in the insulating adhesive agent 2 of the anisotropic conductive adhesive agent 1 are non-uniformly provided on the one side of the two adhering surfaces of the insulating adhesive agent 2. At the time of positioning the anisotropic conductive adhesive agent 1 between the two terminals, if the adhering surface, which is the one to which the conductive particles 3 are non-uniformly provided, is disposed to the side of the terminal, which is the one having a smaller dimension of protrusion toward the adhesive side of two terminals, it prevents the conductive particles 3, which are not positioned there, from being pressed out, even in the case that the insulating adhesive agent 2 is pressed out toward a lateral side by the terminals having a greater dimension of protrusion, at the time of thermal compression bonding. Accordingly, a predetermined number of conductive particles 3 can be included between each of the terminals, thereby improving conductive reliability.

3 Claims, 11 Drawing Sheets

(A)

(B)

(A)

(B)

(A)

(B)

CONNECTING STRUCTURE, LIQUID CRYSTAL DEVICE, ELECTRONIC EQUIPMENT, AND ANISOTROPIC CONDUCTIVE ADHESIVE AGENT AND A MANUFACTURING METHOD THEREOF

TECHNICAL FIELD

The present invention relates to a connecting structure for electroconductive connection of two adherends by an anisotropic conductive adhesive agent. Particularly, the present invention relates to an anisotropic conductive adhesive agent and the manufacturing method thereof, this anisotropic conductive adhesive agent is used particularly for connecting fine-pitched terminals, for example, in case of electrically connecting input terminals of liquid crystal panels (liquid crystal displays) to outer leads in TAB (Tape Automated Bonding); and also relates to a liquid crystal display device and electronic equipment using them.

Further, the present invention relates to an anisotropic conductive adhesive agent and the manufacturing method thereof, the anisotoropic conductive adhesive agent is used for conductive connection between liquid crystal panels and circuit boards, a typical example of which is TAB substrates.

BACKGROUND ART

As shown in FIG. 11 (A), an anisotropic conductive adhesive agent 50 is used for connecting between fine-pitched terminals, such as connecting input terminals 12 provided on a glass substrate 11 constituting a liquid crystal panel to TAB 13 terminals (bumps) 14.

The conventional anisotropic conductive adhesive agents 50 have been comprised of a thermosetting or thermoplastic insulating adhesive agent 51 such as epoxy resin or the like, and a plurality of conductive particles 52 provided in this adhesive agent, wherein the conductive particles 52 is uniformly positioned within this adhesive agent.

Then as shown in FIG. 11 (B), the TAB 13 is thermo compression bonded and the terminal 14 is pressed into the anisotropic conductive adhesive agent 50, thus continuity between the terminals 12 and 14 is realized by means of providing the conductive particles 52 therebetween.

Also, there are cases in which the IC is not mounted on the TAB, but directly mounted upon the glass substrate and a flexible substrate is connected to the input terminals of the IC through the wirings on the glass substrate. In such case, as well, the anisotropic conductive adhesive agent is used for connecting the wiring on the glass substrate and the flexible substrate.

It is preferable to include three to ten or more conductive particles 52 between the each of terminals 12 and 14, in order to secure the conductivity.

However, the conventional anisotropic conductive adhesive agent 50 has a problem that as shown in FIG. 11 (B), when the terminal 14 is pressed into the insulating adhesive agent 51, the insulating adhesive agent 51 provided at the portion of the terminal 14 flows toward to the terminal 14, and the conductive particles 52 of the aforementioned adhesive agent 51 are also flowed together, as a result, the number of conductive particles 52 remaining between the terminals 12 and 14 is reduced and conductive reliability diminishes.

Also, there is the need to include a great number of conductive particles in the insulating adhesive agent in order to make the number of conductive particles remaining between the terminals 12 and 14 enough, and this has been a problem in that the cost of materials for manufacturing the anisotropic conductive adhesive agent is expensive.

It is an object of the present invention to provide an anisotropic conductive adhesive agent which is capable of making a predetermined number of conductive particles being included certainly between the terminals to be connected so as to improve conductive reliability, a manufacturing method for easily manufacturing the anisotropic conductive adhesive agent, and a liquid crystal display device and an electronic equipment containing the anisotropic conductive adhesive agent utilized therein.

SUMMARY OF THE INVENTION

The connecting structure according to the present invention is a connecting structure for electrically connecting two adherends consisting of at least a first adherend on which a plurality of terminals are formed and a second adherend including terminals which are thicker than the terminals formed on the first adherend, the adherends being positioned so as to face one another with the terminals facing inwards across the anisotropic conductive adhesive agent; wherein the anisotropic conductive adhesive agent includes: an insulating adhesive agent; and a plurality of conductive particles distributed on one side of the first adherend.

According to the connecting structure of the present invention, the conductive particles are distributed on one side of the first adherend. Accordingly, an inexpensive connecting structure by which the number of conductive particles included in the anisotropic conductive adhesive agent is reduced can be realized, and a sufficient number of conductive particles can be secured at the electrical connection portion, so the number of defective articles is drastically reduced. Also, regarding the case of performing compression bonding of the first adherend and the second adherend, the conductive particles are not included in the anisotropic conductive adhesive agent which flows out by being pressed out by the terminals provided on the side to which the conductive particles are not unevenly distributed, i.e., by the thicker terminals. Accordingly, the number of conductive particles remaining between the terminals to be connected is not reduced and the connection can be made in a sure manner, and further, the number of conductive particles is made to be uniform at each connected portion, which is extremely desirable from a manufacturing control perspective.

The liquid crystal device according to the present invention is a liquid crystal device comprised of a pair of substrates between which liquid crystal is sealed, and a plurality of terminals formed at least on one of the substrates; and a circuit substrate, which contains a plurality of terminals formed thereon and is electrically connected with said liquid crystal panel by anisotropic conductive adhesive agent, wherein the anisotropic conductive adhesive agent includes: an insulating adhesive agent; and a plurality of conductive particles distributed on one side of a substrate, which is a side being equipped with a terminal, which is the thinner one of the terminals formed on the one substrate and terminals formed on the circuit substrate.

According to the liquid crystal device of the present invention, the conductive particles are unevenly distributed on the thinner side, i.e., to the side of the substrate which has terminals with smaller dimensions of protrusion toward the anisotropic conductive adhesive agent. Accordingly, the number of conductive particles included in the anisotropic conductive adhesive agent can be reduced and thus an inexpensive connecting structure can be realized, and a sufficient number of conductive particles can be secured at the electrical connection portion, so the number of defective articles is drastically reduced. Also, regarding the case of performing compression bonding of the liquid crystal panel substrate and the circuit substrate, the conductive particles are not included in the anisotropic conductive adhesive agent which flows out by being pressed out by the terminals formed on the side, to which conductive particles are not unevenly distributed, i.e., by the thicker terminals. Accordingly, the number of conductive particles remaining between the terminals to be connected is not reduced, and further, the number of conductive particles is uniform at each connected portion, which is extremely desirable from a manufacturing control perspective.

Generally, transparent electrodes such as typified by ITO are formed on the liquid crystal panel substrates, and metal terminals are formed on the circuit substrates such as the TAB substrate. There are many cases that the transparent electrodes such as ITO are thinner compared to the metal terminals, so it is preferable to unevenly distribute the conductive particles to the side of the liquid crystal panel substrate.

The liquid crystal device according to the present invention is a liquid crystal device including: a liquid crystal panel having a pair of substrates between which liquid crystal is sealed and a plurality of terminals formed at least on one of the substrates; and a semiconductor device with a plurality of bumps formed thereupon, which are electrically connected with said liquid crystal panel by anisotropic conductive adhesive agent, wherein the anisotropic conductive adhesive agent includes: an insulating adhesive agent; and a plurality of conductive particles unevenly distributed on the side of the one substrate.

According to liquid crystal device of the present invention, the conductive particles are unevenly distributed to one substrate, i.e., to the side of the substrate which has terminals with smaller dimensions of protrusion toward the anisotropic conductive adhesive agent. Accordingly, the number of conductive particles included in the anisotropic conductive adhesive agent can be reduced and thus an inexpensive connecting structure can be realized, and a sufficient number of conductive particles can be secured at the electrical connection portion, so the number of defective articles is drastically reduced. Also, regarding the case of performing compression bonding of the liquid crystal panel substrate and the semiconductor device, conductive particles are not included in the anisotropic conductive adhesive agent which flows out by being pressed out by the bumps. Accordingly, the number of conductive particles remaining between the terminals of the liquid crystal panel substrate and the bumps is not reduced, and further, the number of conductive particles is uniform at each connection portion, which is extremely desirable from a manufacturing control perspective.

The method for manufacturing a liquid crystal device according to the present invention is a method having a step for sandwiching liquid crystal between a pair of substrates, and electrically connecting a liquid crystal panel containing a terminal group provided on the one of said substrates to a circuit substrate containing a terminal group provided thereupon, the method comprising the steps of: a step for disposing, between the one substrate and the circuit substrate, an anisotropic conductive adhesive agent containing an insulating adhesive agent and a plurality of conductive particles, the conductive particles being unevenly distributed on one of the adhering surfaces, such that the one adhering surface and the one substrate come into contact; and a step for performing compression bonding of the one substrate and the circuit substrate.

According to the method for manufacturing a liquid crystal device of the present invention, the liquid crystal panel substrate, the anisotropic conductive adhesive agent, and the circuit substrate are disposed such that the substrate with thinner terminals, i.e., the liquid crystal panel substrate comes into contact with the surface of the anisotropic conductive adhesive agent to which there is uneven distribution of conductive particles, and the circuit substrate comes into contact with the surface of the anisotropic conductive adhesive agent to which there is not uneven distribution of conductive particles. Then, the aforementioned liquid crystal panel substrate and the aforementioned circuit substrate are bonded with compression. The conductive particles are not provided to the side of the terminals with greater dimensions of protrusion toward the anisotropic conductive adhesive agent, i.e., to the side of thicker terminals, so even in the event that the anisotropic conductive adhesive agent is pressed out to the lateral side by the terminals, the conductive particles are rarely moved by the flow, so the predetermined number of conductive particles can be included between each of the terminals, thereby the conductive reliability is improved.

The method for manufacturing a liquid crystal device according to the present invention is a method having the steps for sandwiching liquid crystal between a pair of substrates, and electrically connecting a liquid crystal panel with a terminal group provided on the one of said substrates to a semiconductor device containing the bumps formed thereupon, the method comprising the steps of: a step for disposing, between the one substrate and the semiconductor device, an anisotropic conductive adhesive agent containing an insulating adhesive agent and a plurality of conductive particles, the conductive particles being unevenly distributed on one of the adhering surfaces, such that the one adhering surface and the one substrate come into contact; and a step for performing compression bonding of the one substrate and the semiconductor device.

According to the method for manufacturing the liquid crystal device of the present invention, the liquid crystal panel substrate, the anisotropic conductive adhesive agent, and the semiconductor device are disposed such that the substrate with thinner terminals, i.e., the liquid crystal panel substrate comes into contact with the adhering surface of the surfaces of the anisotropic conductive adhesive agent, which is a side provided with conductive particles unevenly distributed on, and the semiconductor device comes into contact with the adhering surface of the surfaces of the anisotropic conductive adhesive agent, which is a side not provided with conductive particles unevenly distributed thereon. Then, the aforementioned liquid crystal panel substrate and the aforementioned semiconductor device are bonded with compression. The conductive particles are not provided to the side of the terminals with greater dimensions of protrusion toward the anisotropic conductive adhesive agent, i.e., to the side of the bumps, so even in the event that the anisotropic conductive adhesive agent is pressed out to the lateral side by the bumps, the conductive particles are rarely moved by the flow, so the predetermined number of conductive particles can be included between each of the bumps and terminals, thereby the conductive reliability is improved.

The electronic equipment according to the present invention has the aforementioned liquid crystal display device, and a casing in which this liquid crystal display device is stored, e.g., cellular telephones, wristwatches, notebook computers, etc.

Such electronic equipment use the anisotropic conductive adhesive agent according to the present invention for adhesion of the liquid crystal panel to a circuit substrate or a semiconductor device, so the conductive reliability of the liquid crystal panel can be improved, and the incidence of defective electronic equipment can be reduced, also reducing manufacturing costs.

The anisotropic conductive adhesive agent according to the present invention contains an insulating adhesive agent and a plurality of conductive particles, and has a plurality of adhering surface to adhere to a plurality of adherends; wherein the abovementioned conductive particles are unevenly distributed on the side of said one adhering surface. At this time, it is preferable that the conductive particles be positioned on the one adhering surface, and also a coating adhesive material be applied over the conductive particles.

According to the structure as mentioned above, namely positioning the conductive particles on the adhering surface of the insulating adhesive agent, the conductive particles can be unevenly distributed to one adhering surface, surely with a simple manner. Also, coating the conductive particles with an adhesive prevents the conductive particles from peeling away or coming loose, thereby it facilitates the ease of handling of the anisotropic conductive adhesive agent.

Also, it is preferable that a base material be positioned on said one adhering surface on which the conductive particles are unevenly distributed. Specifically, the base material is a separator (peel-away sheet) or the like.

In this case also, the conductive particles can be unevenly distributed to one adhering surface, surely with a simple manner. Also, covering the conductive particles with base material prevents the conductive particles from peeling away or coming loose, thereby it facilitates the ease of handling of the anisotropic conductive adhesive agent. Also, the only thing that is necessary to utilize the anisotropic conductive adhesive agent is to remove the base material comprised of a separator or the like, thereby it can be utilized easily.

The method according to the present invention for manufacturing anisotropic conductive adhesive agent containing an insulating adhesive agent and a plurality of conductive particles is a method comprising the steps of: a step for sprinkling conductive particles on the insulating adhesive agent; and a step for applying a coating adhesive material over the conductive particles.

According to the method for manufacturing the anisotropic conductive adhesive agent by the present invention, the conductive particles are sprinkled upon the insulating adhesive agent.

Thus, the sprinkled conductive particles are temporarily fixed by the insulating adhesive agent and do not move after sprinkling, so the conductive particles can be placed on the insulating adhesive agent, uniformly. Further, the conductive particles are coated with a coating adhesive agent, so the conductive particles are protected and prevented from coming loose.

Also, the method according to the present invention for manufacturing anisotropic conductive adhesive agent containing an insulating adhesive agent and a plurality of conductive particles, is a method comprising the steps of: a step for sprinkling the conductive particles on the base material; and a step for applying the insulating adhesive agent over the surface of the base material upon which the conductive particles have been sprinkled.

According to such a manufacturing method, only one step is required to sprinkle the insulating adhesive agent, thereby manufacturing efficiency is improved. Also, the conductive particles are covered with a base material, thereby the conductive particles are protected in a secure manner. Further, using a separator as the base material does away with the need to prepare a base material for manufacturing, independently, and in addition, it allows easy manufacturing of a tape-shaped anisotropic conductive adhesive agent.

BEST MODE FOR CARRYING OUT THE INVENTION

Embodiments of the present invention will be described in further detail below with reference to the drawings.

First Embodiment

Figure 1:
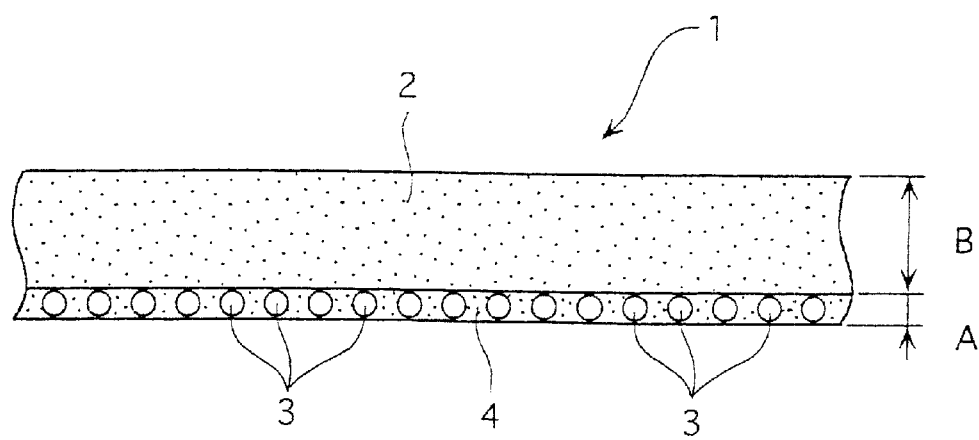
FIG. 1 is a cross-sectional view showing the anisotropic conductive adhesive agent according to the first embodiment of the present invention.

FIG. 1 shows the anisotropic conductive adhesive agent 1 according to the first embodiment of the present invention. The anisotropic conductive adhesive agent 1 has an insulating adhesive agent 2 and a plurality of conductive particles 3. The conductive particles 3 are provided on one of the adhering surfaces of the insulating adhesive agent 2, and covered with a coating adhesive agent 4.

The conductive particles 3 may be: solder particles; single metal particles such as Ni, Au, Ag, Cu, Pb, Sn, or the like; complex metal particles of mixtures, alloys, or electroplating of multiple metals; particles formed by electroplating of plastic particles (polystyrenes, polycarbonates, acrylics, divinyl benzene resins) with a single or a plurality of Ni, Au, Cu, Fe, etc.; carbon particles; etc.

Also, the insulating adhesive agent 2 and coating adhesive agent 4 may be of an identical adhesive agent or different adhesive agents. Specifically, they are single or a multiple mixture or a compound of styrene butadiene styrenes (SBS), epoxies, acrylics, polyesters, urethanes, etc.

Incidentally, the particle diameter of the conductive particles 3 (measurement A in FIG. 1) is approximately 2 to 10 μm, and the film thickness (measurement B in FIG. 1) of the adhesive agent 2 is approximately 12 to 30 μm. Also, the coating adhesive agent 4 coated on the conductive particles 3 coats the conductive particles 3 with a thin film thickness of around 1 to 3 μm.

Figure 3:
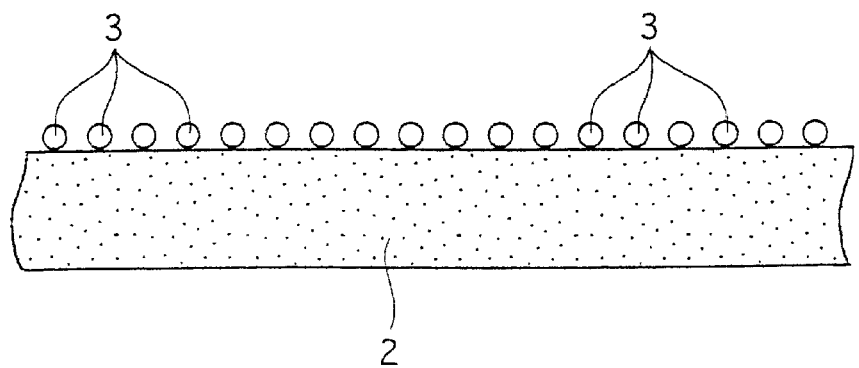
FIGS. 3A and B are cross-sectional diagrams illustrating the process for manufacturing the anisotropic conductive adhesive agent according to the first embodiment.
Figure 3:
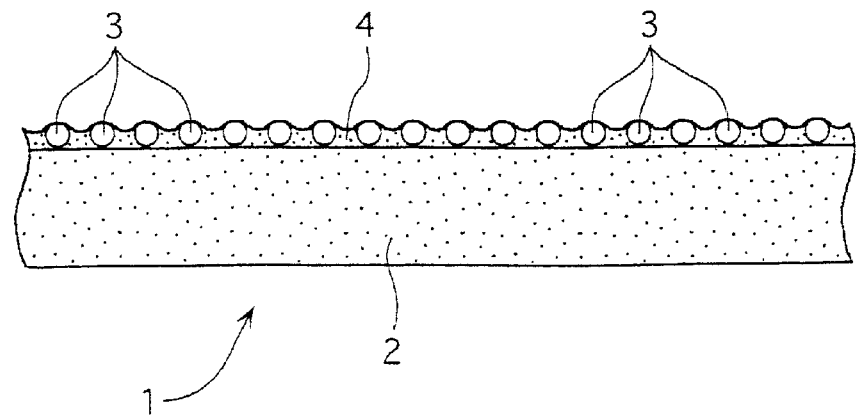

The anisotropic conductive adhesive agent 1 with such a structure is formed according to the procedures shown in FIG. 3.

That is to say, firstly, the insulating adhesive agent 2 is formed according to a predetermined film thickness and width dimensions. Then, as shown in FIG. 3 (A), the conductive particles 3 are sprinkled on one of the adhering surfaces of the insulating adhesive agent 2, and are fixed. As for the method of sprinkling the conductive particles 3, various methods can be employed, such as the dry method in which the conductive particles 3 are sprinkled by air flow, static electricity, free falling, etc., the wet method in which the conductive particles 3 are mixed into a solvent and sprayed, the printing method, etc. At this time, it is preferable that the conductive particles 3 be sprinkled such that there are two or less rows (one overlapping on another) in the direction of thickness of the insulating adhesive agent 2, and more preferable, such that there is only one row (no conductive particles 3 overlapping on other conductive particles 3). Hence, it is preferable, for example, to charge the conductive particles 3, so that the conductive particles 3 repel each other and are sprinkled without overlapping one another.

Then, as shown in FIG. 3 (B), the adhesive agent 4 is applied to the conductive particles 3 by means of the spraying method or printing method or the like, thus coating the conductive particles 3.

Such an anisotropic conductive adhesive agent according to the first embodiment is advantageous in that:

[1] The conductive particles 3 are unevenly dispersed to one of the adhering surfaces of the anisotropic conductive adhesive agent 1. Accordingly, it is possible to prevent conductive terminals 3 from flowing toward the terminal 12 (see FIG. 2) when the terminal 14 is pressed into the adhesive agent, by means of positioning one of the adhering surfaces, which is the one having the conductive particles 3 unevenly dispersed thereon, to the side of the terminal 12 with smaller protrusion dimensions out of the terminals 12 and 14, which are to be made conductive by the anisotoropic agent 1. As a result, a predetermined number of conductive particles 3 can be included between the terminals 12 and 14 in a sure manner, and conductive reliability of the terminals 12 and 14 can be improved.

[2] The conductive particles 3 are disposed in one row in the direction of film thickness of the anisotropic conductive adhesive agent 1, so the number of conductive particles 3 included between the terminals 12 and 14 can be easily controlled by the area of connection surface of the terminals 12 and 14 and the number of conductive particles 3 sprinkled per unit area. Accordingly, the number of conductive particles 3 included between the terminals 12 and 14, i.e., the conductive capabilities can be precisely adjusted and set.

[3] Also, the adhesive agent 2 pressed out to the lateral side of the terminal 14 by the terminal 14 is filled into the gap between the terminals 12 and 14 positioned at a certain pitch, thereby further increased adhesive strength of the glass substrate 11 and TAB 13 can be obtained. At this time, the amount of adhesive agent 2 flowing out can be controlled with high precision by the volume of the terminal 14 etc. Accordingly, the amount of adhesive agent 2 flowing out can be adjusted such that strong adhesion strength can be obtained but not too excessive amount of adhesive agent 2, which causes of the remaining residual stress, is not filled.

[4] Upon manufacturing of the anisotropic conductive adhesive agent 1, conductive particles 3 are sprinkled to one of the adhering surfaces of the insulating adhesive agent 2, as a result, the anisotropic conductive adhesive agent 1 which has conductive particles 3 unevenly dispersed on the side of the one of the adhering surfaces can be manufactured easily and with sure manner, and manufacturing costs can also be reduced.

[5] The conductive particles 3 are sprinkled on the insulating adhesive agent 2, so the conductive particles 3 which are sprinkled can be temporarily fixed with the adhesive agent 2, thereby the conductive particles 3 are prevented from moving after the sprinkling, as a result, uniform positioning is realized. The conductive particles 3 are coated with the adhesive agent 4, so the conductive particles 3 sprinkled on the surface of the insulating adhesive agent 2 can be prevented from coming loose, thereby also the incidence of defective articles can be reduced.

Second Embodiment

Next, a second embodiment according to the present invention will be described with reference to FIG. 7. Incidentally, in the present embodiment, the portions which are identical or equivalent to those in the above-described first embodiment are provided with the same reference numerals, and description thereof is either omitted or simplified.

The second embodiment discloses the case wherein the method of manufacturing the anisotropic conductive adhesive agent 1 is the main difference from that of the above embodiment.

Figure 7:
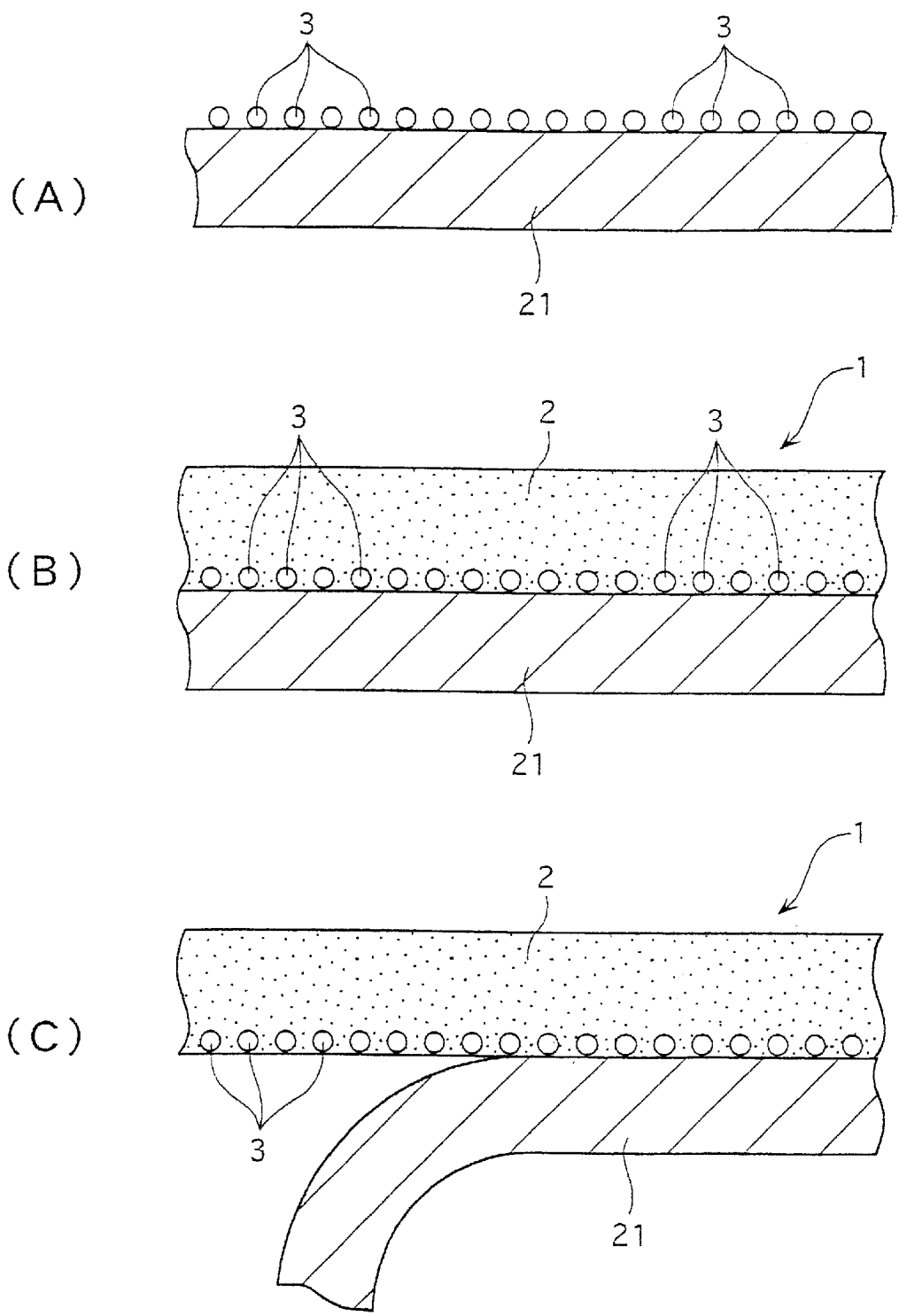
FIGS. 7A–C are cross-sectional views illustrating the process of manufacturing the anisotropic conductive adhesive agent according to a second embodiment according to the present invention.

That is, in order to manufacture the anisotropic conductive adhesive agent 1 according to the present embodiment, first, as shown in FIG. 7, conductive particles 3 are applied dispersedly to the base material 21 used as a peeling sheet (separator) by means of sprinkling. As for the method of this sprinkling of the conductive particles 3, the various methods can be used as same as the above first embodiment, but it is particularly preferable to use the printing method or spray-coating method in order to temporarily fix the conductive particles 3 upon the base material 21.

Then, as shown in FIG. 7 (B), the insulating adhesive agent 2 is applied to the base material 21 upon which the conductive particles 3 have been sprinkled, by means of the printing method or spraying method.

The anisotropic conductive adhesive agent 1 manufactured as mentioned above has the base material 21 which is the separator. Firstly, the base material 21 is peeled away as shown in FIG. 7 (C), and then the, adhesive agent 1 is disposed between the terminals 12 (see FIG. 2) and 14 such that the adhering surface to which the conductive particles 3 are unevenly dispersed (the lower side in FIG. 7) faces the terminal 12, as same as the first embodiment shown by FIG. 2. Then, thermal compression bonding or the like is carried out, and the conductive particles 3 are included between the terminals 12 and 14, thereby conduction between them are realized.

This second embodiment also has the same advantages as [1] through [3] in the above first embodiment.

[6] Further, regarding the manufacturing of the anisotropic conductive adhesive agent 1, after the conductive particles 3 are sprinkled on the base material (separator) 21, the insulating adhesive agent 2 is applied thereupon. As a result, an anisotropic conductive adhesive agent 1 which has conductive particles 3 unevenly dispersed to one of the adhering surfaces can be manufactured easily with a sure manner, and manufacturing costs can also be reduced.

[7] Also, regarding the manufacturing of the anisotropic conductive adhesive agent 1, only one step is required to apply the adhesive agent 2, and so manufacturing efficiency is improved over the above first embodiment in which adhesive agents 2 and 4 are applied.

[8] Further, the conductive particles 3 are covered with the base material 21. Accordingly, if the base material 21 is left until when the anisotropic conductive agent 1 is used, the conductive particles 3 can be protected by the base material 21, thereby the conductive particles 3 are prevented from peeling away or coming loose, and the incident of defective articles is reduced.

Third Embodiment

Figure 2:
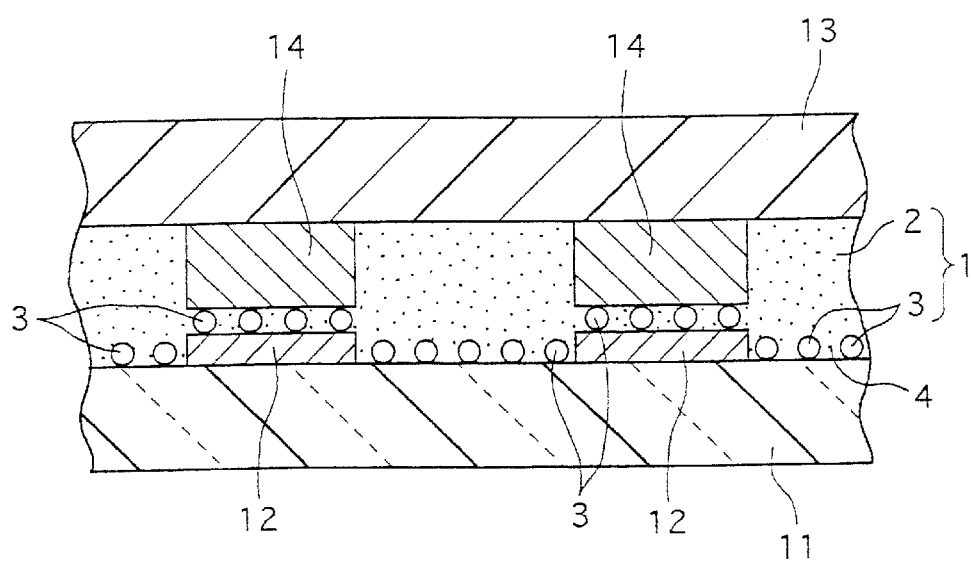
FIG. 2 is a cross-sectional view showing a terminal connection portion using the anisotropic conductive adhesive agent according to the first embodiment.

FIG. 2 is an example of adhesion of a TAB 12 and liquid crystal panel substrate 11 using the anisotropic conductive adhesive agents described in the first and second embodiments. Also, FIG. 3 is an overall construction diagram of the liquid crystal device according to the present embodiment.

As shown in FIG. 2, anisotropic conductive adhesive agent 1 is positioned between the terminal 12 provided upon the glass plate 11 of the liquid crystal panel and the terminal (bump) 14 of the TAB 13.

The terminal 12 is formed of ITO or metal wiring, and the dimensions of protrusion toward the side of the anisotropic conductive adhesive agent 1 is thin, about 0.1 to 3 $\mu$m. On the other hand, the dimensions of protrusion of the bump 14 is thick, about 20 to 30 $\mu$m. Accordingly, the anisotropic conductive adhesive agent 1 is positioned such that the adhering surface, to which the conductive particles 3 are unevenly dispersed (lower side in FIG. 2), faces the input terminal 12.

Then, the terminals 12 and 14 are pressed into the anisotropic conductive adhesive agent 1 by thermal compression bonding or the like, and the conductive particles 3 are included between the terminals 12 and 14, thereby the conduction between them is realized. At the time of pressing the terminal 14 into the insulating adhesive agent 2, although the adhesive agent 2 flows to the lateral side, conductive particles 3 are not positioned in the aforementioned part of the adhesive agent 2, but rather are positioned to the side of the terminal 12 which hardly moves the conductive particles 3 and adhesive agents 2 and 4 due to the small diameter of the protrusion thereof. Consequently, the conductive particles 3 do not flow out from between the terminals 12 and 14, and the predetermined number of the conductive particles 3 remain between the terminals 12 and 14. Further, the gap between the terminals 12 and 14 positioned at a certain pitch is filled with the adhesive agent 2, which includes the adhesive agent flowed out due to the terminal 14, thereby the glass substrate 11 and TAB 13 is adhered securely.

Figure 4:
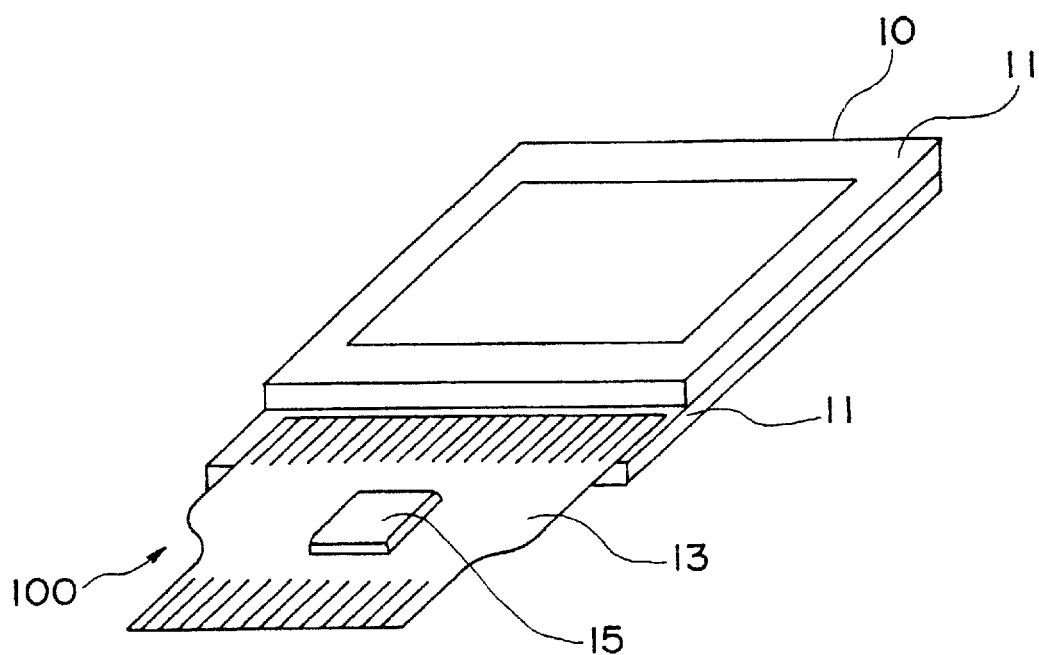
FIG. 4 is a perspective view showing a liquid crystal element using the anisotropic conductive adhesive agent according to the present invention.

By means of such procedures, a liquid crystal display device 100, in which a liquid crystal panel 10 is adhered to a TAB 13, which is equipped with a liquid crystal driver IC 15, by anisotropic conductive adhesive agent 1 is formed, as shown in FIG. 4.

Fourth Embodiment

Figure 9:
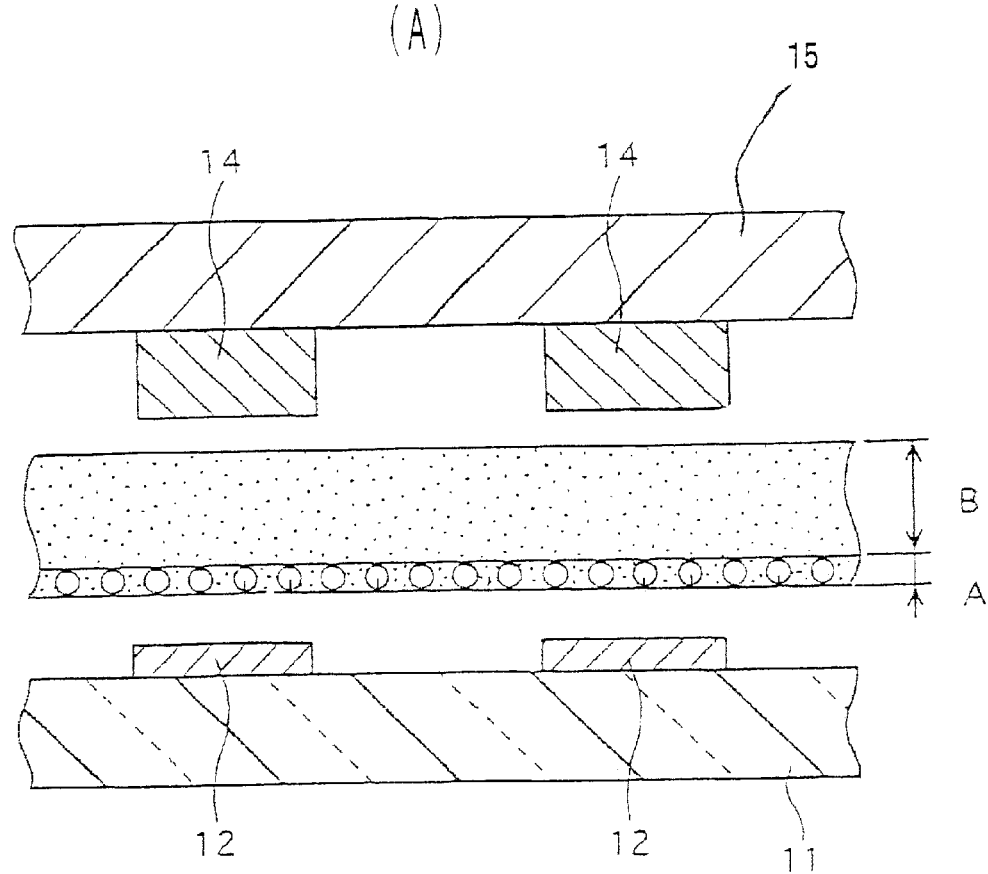
FIGS. 9A and B are diagrams showing connection of a liquid crystal driver IC and liquid crystal panel substrate, using the anisotropic conductive adhesive agent according to the present invention, wherein (A) illustrates the state of before the connection, and (B) illustrates the state of after the connection.
Figure 9:
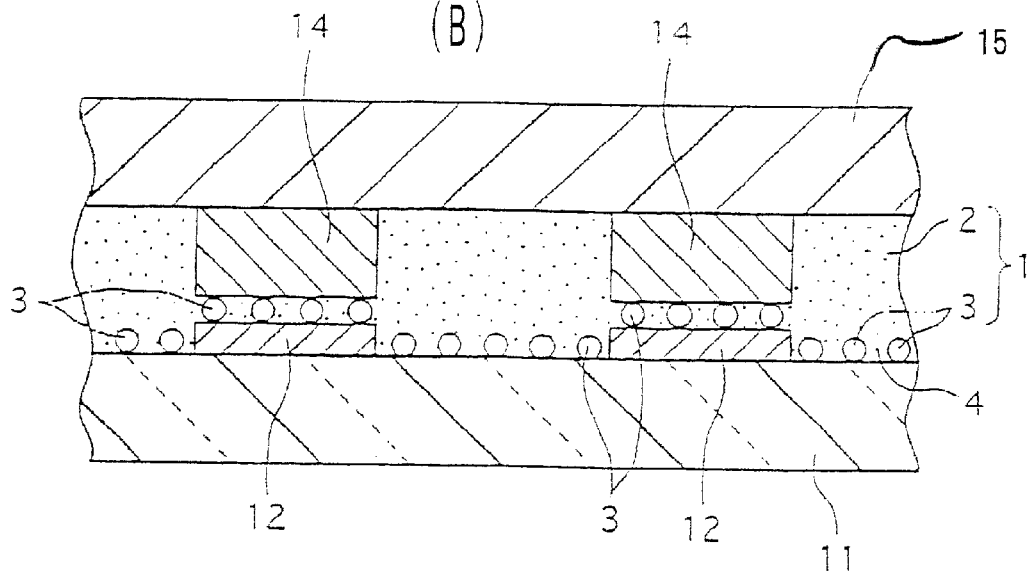

FIG. 9 (A) is a cross-sectional diagram (before adhesion) of a liquid crystal device according to the so-called COG method, in which a liquid crystal driver IC 15 and liquid crystal panel substrate 11 are directly adhered using the anisotropic conductive adhesive agent described in the first and second embodiments, and FIG. 9 (B) is a drawing showing the arrangement after the adhesion.

As shown in FIG. 9 (A), the anisotropic conductive adhesive agent 1 is positioned between the terminal 12 provided upon the glass substrate of the liquid crystal panel, and the terminal (bump) 16 of the liquid crystal driver IC 15.

The terminal 12 is formed of ITO or metal wiring, and the dimensions of protrusion toward the side of the anisotropic conductive adhesive agent 1 is thin, about 0.1 to 3 $\mu$m. On the other hand, the dimensions of protrusion of the terminals (bump) 16 of the liquid crystal driver IC is thick, about 10 to 28 $\mu$m. Accordingly, the anisotropic conductive adhesive agent 1 is positioned such that the adhering surface, to which the conductive particles 3 are unevenly dispersed (lower side in FIG. 9), faces the input terminal 12 of the liquid crystal panel substrate 11.

Then, the terminals 12 and 16 are pressed into the anisotropic conductive adhesive agent 1 by thermal compression bonding or the like, and the conductive particles 3 are included between the terminals 12 and 16, thereby the conduction between them is realized. At the time of pressing the terminal 16 into the insulating adhesive agent 2, although the adhesive agent 2 flows to the lateral side, conductive particles 3 are not positioned in the aforementioned part of the adhesive agent 2, but rather are positioned to the side of the terminal 12 which hardly moves the conductive particles 3 and adhesive agents 2 and 4 due to the small diameter of the protrusion thereof. Consequently, the conductive particles 3 do not flow out from between the terminals 12 and 16, and the predetermined number of the conductive particles 3 remain between the terminals 12 and 16. Further, the gap between the terminals 12 and 14 positioned at a certain pitch is filled with the adhesive agent 2, which includes the adhesive agent flowed out due to the terminal 16, thereby the glass substrate 11 and TAB 13 are adhered securely.

Figure 10:
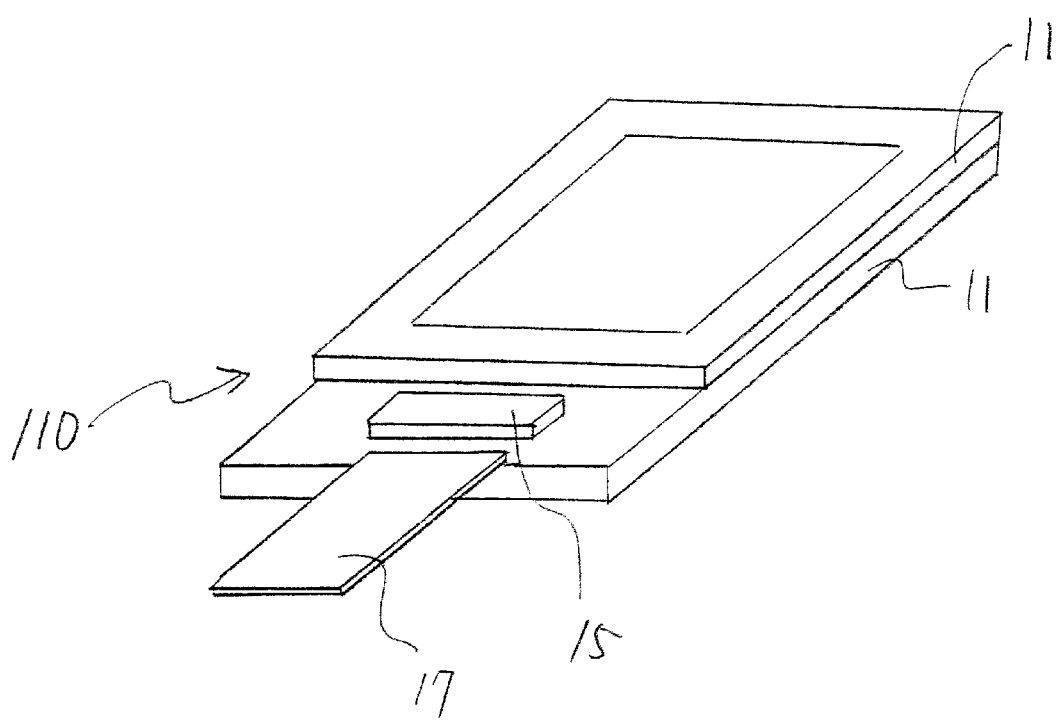
FIG. 10 is an overall constructional diagram of a liquid crystal device making connections using the anisotropic conductive adhesive agent according to the present invention.
Figure 11A:
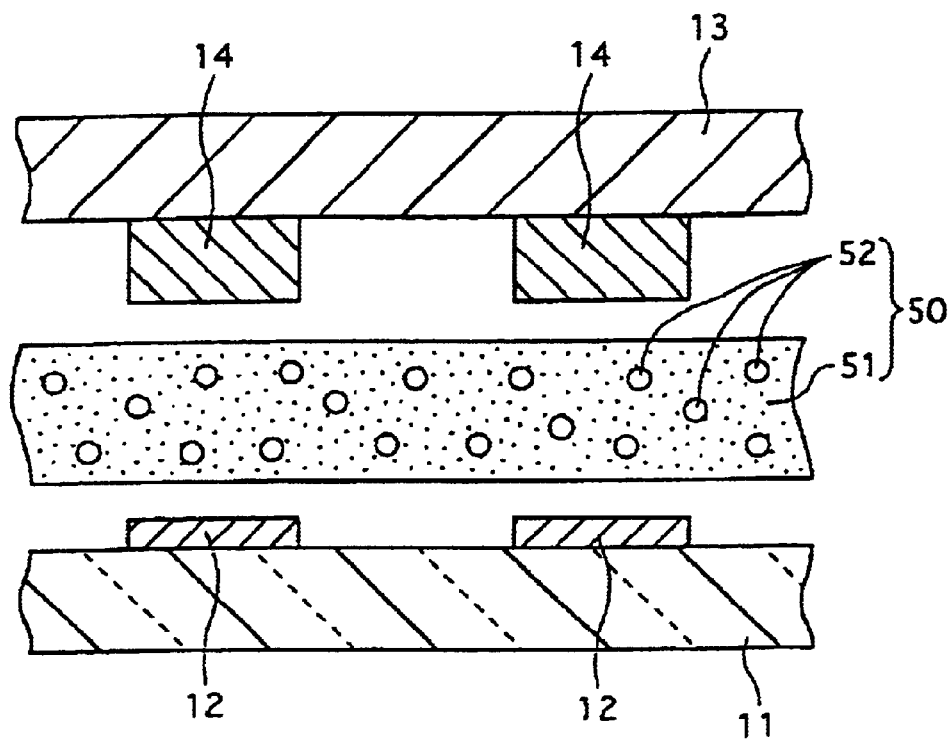
FIGS. 11A and B are cross-sectional views showing a conventional anisotropic conductive adhesive agent described in the present invention.
Figure 11B:
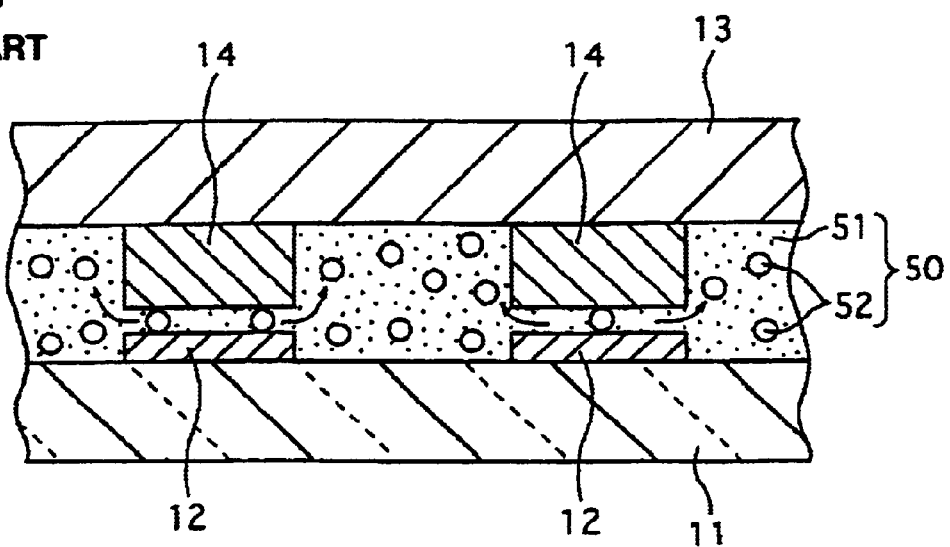

By means of such procedures, a liquid crystal display device 110, in which a liquid crystal panel 10 is adhered to a liquid crystal driver IC 15 by anisotropic conductive adhesive agent 1, is formed, as shown in FIG. 10. The wirings are omitted in FIG. 10.

Fifth Embodiment

Figure 5:
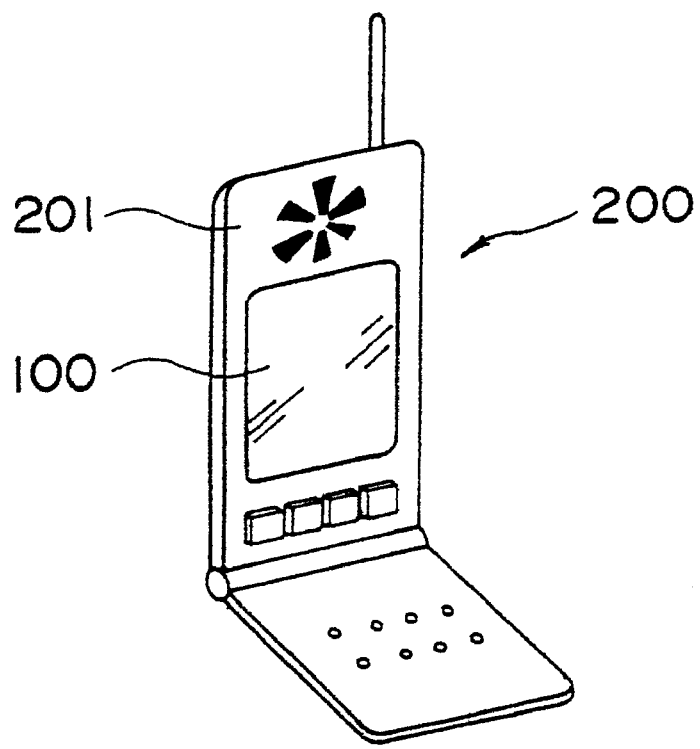
FIG. 5 is a perspective view showing a cellular telephone according to the present invention.
Figure 6:
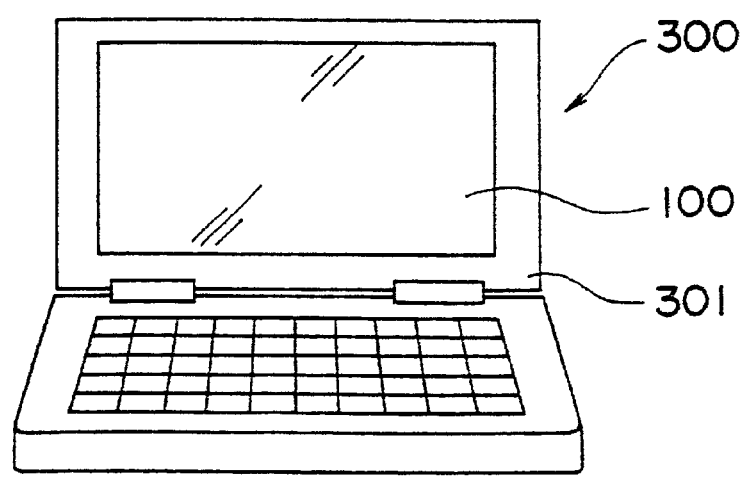
FIG. 6 is a perspective view showing a notebook computer according to the present invention.

The liquid crystal devices 100 and 110 given as examples in the third and fourth embodiments are assembled into electronic equipment casing of various types. For example, they may be assembled into casing 201 for a cellular telephone 200 as shown in FIG. 5, or assembled into casing 301 for a notebook computer 300 as shown in FIG. 6.

Although the present invention has been described with the first through fifth embodiments, the present invention is not restricted to these embodiments. The present invention includes modifications and improvements capable of achieving the objects of the present invention.

Figure 8:
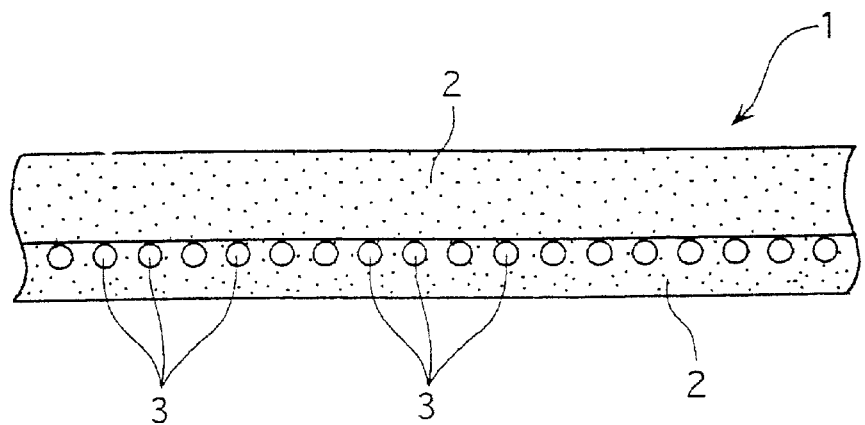
FIGS. 8A and B are cross-sectional views showing the anisotropic conductive adhesive agent according to a variation of the present invention.
Figure 8:
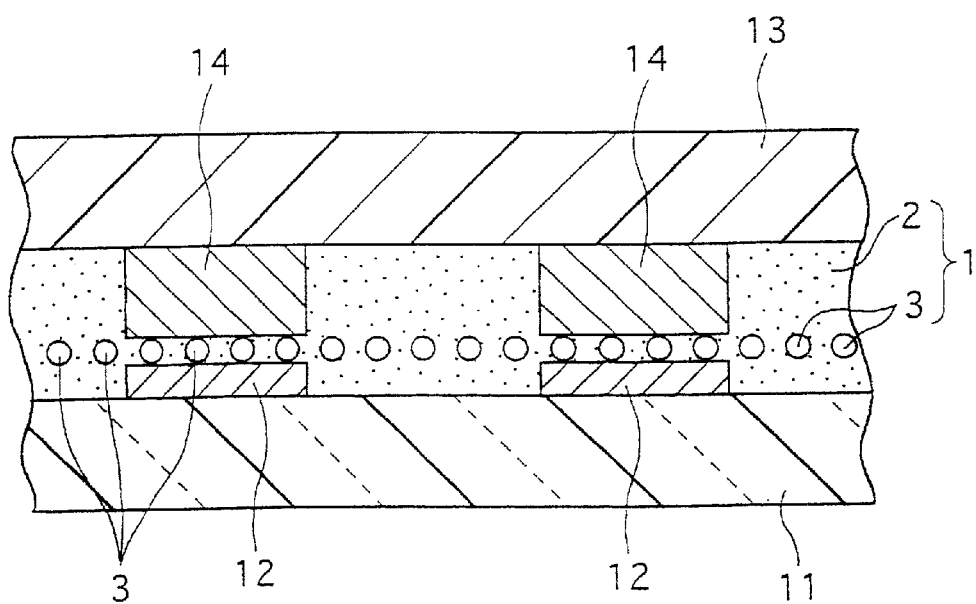

For example, in each of the aforementioned embodiments, the conductive particles 3 are positioned at the outermost surface of one of the adhering surfaces of the anisotropic conductive adhesive agent 1, but instead, the conductive particles 3 may be positioned further inwards from the outermost surface as shown in FIG. 8 (A); in other words, any arrangement is applicable as long as the conductive particles 3 are provided at a position between the center of the film thickness direction of the anisotropic conductive adhesive agent 1, and the either adhering surface side.

In this case, the anisotropic conductive adhesive agent 1 can be formed by sprinkling the conductive particles 3 on the insulating adhesive agent 2, and then applying the insulating adhesive agent 2 thicker than the coating adhesive agent 4 of the first embodiment. As shown in FIG. 8 (B), such an anisotropic conductive adhesive agent 1 allows the conductive particles 3 to be positioned in accordance with the connection position of the terminals 12 and 14, so particularly, even in the case that the terminal 12 is made to be relatively great in thickness as well as the terminal 14, the movement of the conductive particles 3 with the insulating adhesive agent 2 due to each of the terminals 12 and 14 can be minimized, and thus the predetermined number of conductive particles 3 remain between the terminals 12 and 14.

However, as to the terminal 12 or the like formed of ITO film or the like, in view of their extremely small height dimensions, so generally, as described in the first and second embodiments, it is more advantageous to provide the conductive particles 3 at the outermost surface of the anisotropic conductive adhesive agent 1, because the movement of the conductive particles 3 at the time of connecting the terminals 12 and 14 can be minimized, and thus it is possible to keep a great number of conductive particles 3 between the terminals 12 and 14 more surely, to make them contribute to conduction. In this case, even if the number of conductive particles 3 in the anisotropic conductive adhesive agent 1 is reduced, still high reliability in conduction can be obtained, so the cost of the anisotropic conductive adhesive agent 1 can be reduced, and connections with even finer pitches can be dealt with.

Also, according to the above second embodiment, the base material 21 is not restricted to a separator, but metal plates used in the manufacturing equipment for manufacturing the anisotropic conductive adhesive agent 1 etc., may be used. Such an anisotropic conductive adhesive agent 1 manufactured on the base material 21 for manufacturing can be peeled away from the base material 21 for use.

Further, the anisotropic conductive adhesive agent 1 according to the present invention is not restricted to one which is used in continuity between the terminal 12 of the glass 11 for liquid crystal panel and the terminal 14 of the TAB 13, or other one used in to continuity between the terminal 12 and the terminal 16 of the IC 15; but rather includes the one which can be widely used for continuity between various types of electrical parts. Accordingly, the material, size (film thickness and particle diameter), etc., of the insulating adhesive agent 2 and conductive particles 3 of the anisotropic conductive adhesive agent 1 should be set according to the type of adherends. Hence, the electronic equipment, which is applicable to use the anisotropic conductive adhesive agent 1 according to the present invention are not restricted to such having the liquid crystal display device 100, such as the cellular telephone 200 (FIG. 5) or the notebook computer 300 (FIG. 6), but rather includes the various types of electronic equipment without liquid crystal display devices, as well.

What is claimed is:

1. A method for manufacturing an anisotropic conductive adhesive agent containing an insulating adhesive agent and a plurality of conductive particles, said method comprising the steps in the order of:

a first step for forming said insulating adhesive agent and a coating of adhesive material of the same material;

a second step for sprinkling the conductive particles on said insulating adhesive agent; and a third step for applying said coating of adhesive material over said conductive particles.

2. A method for manufacturing a connecting structure for electrically connecting a first adherend and a second adherend, said method comprising:

providing a plurality of terminals on a surface of the first adherend;

providing a plurality of terminals on a surface of the second adherend, said plurality of terminals of the second adherend being thicker than said plurality of terminals of the first adherend;

positioning the first and second adherends such that said terminals of the first adherend oppose said terminals of the second adherend;

forming an anisotropic conductive adhesive agent by steps in the order of:
a first step of providing an insulating adhesive agent,
a second step of sprinkling a plurality of conductive particles on one adhering surface of said insulating adhesive agent, and
a third step of applying a coating material over said plurality of conductive particles;

disposing said anisotropic conductive adhesive agent between the first adherend and the second adherend such that said coating material is adjacent said terminals of the first adherend; and forming said insulating adhesive agent and said coating material of the same material.

3. The method for manufacturing according to claim 2 further comprising the step of performing compression bonding of the first adherend and the second adherend.

* * * * *